United States Patent
Hsu et al.

(10) Patent No.: US 11,239,146 B2
(45) Date of Patent: Feb. 1, 2022

(54) PACKAGE STRUCTURE

(71) Applicant: Industrial Technology Research Institute, Hsinchu (TW)

(72) Inventors: Chien-Min Hsu, New Taipei (TW); Chih-Ming Shen, New Taipei (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 0 days.

(21) Appl. No.: 16/923,554

(22) Filed: Jul. 8, 2020

(65) Prior Publication Data

US 2021/0202367 A1    Jul. 1, 2021

(30) Foreign Application Priority Data

Dec. 31, 2019   (TW) ................ 108148596

(51) Int. Cl.
*H01L 23/498* (2006.01)
*H01L 23/31* (2006.01)
*H01L 23/00* (2006.01)

(52) U.S. Cl.
CPC .... *H01L 23/49838* (2013.01); *H01L 23/3157* (2013.01); *H01L 23/4985* (2013.01); *H01L 23/49866* (2013.01); *H01L 24/05* (2013.01); *H01L 2224/05124* (2013.01); *H01L 2224/05147* (2013.01)

(58) Field of Classification Search
CPC .............................................. H01L 23/49838
See application file for complete search history.

(56) References Cited

U.S. PATENT DOCUMENTS

| | | | |
|---|---|---|---|
| 6,277,669 B1 | 8/2001 | Kung et al. | |
| 6,324,754 B1 * | 12/2001 | DiStefano | H01L 24/81 29/840 |
| 8,076,762 B2 | 12/2011 | Chandrasekaran et al. | |
| 9,385,099 B2 | 7/2016 | van Gemert et al. | |
| 9,647,188 B2 | 5/2017 | Tischler | |

(Continued)

FOREIGN PATENT DOCUMENTS

| | | |
|---|---|---|
| CN | 100466246 C | 3/2009 |
| TW | 510039 | 11/2002 |

(Continued)

OTHER PUBLICATIONS

Taiwan Paten Office, Office Action, Patent Application Serial No. 108148596, dated Nov. 20, 2020, Taiwan.

(Continued)

*Primary Examiner* — William A Harriston

(57) ABSTRACT

A package structure is provided. The package structure includes a substrate. The package structure also includes a hybrid pad disposed on the substrate. The hybrid pad includes a metal layer and a buffer layer connected to the metal layer. The Young's modulus of the buffer layer is less than the Young's modulus of the metal layer. The package structure further includes an electrically connecting structure disposed on the hybrid pad. The package structure includes a chip layer electrically connected to the electrically connecting structure. The package structure also includes a bonding pad disposed between the electrically connecting structure and the chip layer.

12 Claims, 5 Drawing Sheets

(56) References Cited

U.S. PATENT DOCUMENTS

| | | | |
|---|---|---|---|
| 9,778,688 B2 | 10/2017 | Tang et al. | |
| 2011/0037156 A1* | 2/2011 | Chandrasekaran | H01L 25/50 257/686 |
| 2012/0281378 A1 | 11/2012 | Chen | |
| 2016/0194517 A1* | 7/2016 | Saito | H01L 24/81 523/400 |

FOREIGN PATENT DOCUMENTS

| | | |
|---|---|---|
| TW | I305390 B | 1/2009 |
| TW | 201312720 A | 3/2013 |
| TW | I483363 B | 5/2015 |

OTHER PUBLICATIONS

Kim, Ji-Hye, et al., "Bending Properties of Anisotropic Conductive Films Assembled Chip-in-Flex Packages for Wearable Electronics Applications", IEEE Transactions on Components, Packaging and Manufacturing Technology, Feb. 2016, pp. 208-215, vol. 6, No. 2, IEEE, US.

Kim, Young-Lyong, et al., "Effects of the Mechanical Properties of Polymer Resin and the Conductive Ball Types of Anisotropic Conductive Films on the Bending Properties of Chip-in-Flex Package", IEEE Transactions on Components, Packaging and Manufacturing Technology, Feb. 2016, pp. 200-207, vol. 6, No. 2, IEEE, US.

Kim, Ji-Hyun, et al., "Effects of the Types of Anisotropic Conductive Films on the Bending Reliability of Chip-in-Plastic Packages", IEEE Transactions on Components, Packaging and Manufacturing Technology, Mar. 2019, pp. 405-411, vol. 9, No. 3, IEEE, US.

* cited by examiner 13-3

13-4

PACKAGE STRUCTURE

CROSS REFERENCE TO RELATED APPLICATIONS

This application claims the benefit of Taiwan Patent Application No. 108148596, filed Dec. 31, 2019, the entirety of which is incorporated by reference herein.

TECHNICAL FIELD

Embodiments of the present disclosure relate to a package structure, and in particular they relate to a package structure including a hybrid pad.

BACKGROUND

With the development of science and technology, the volume of electronic devices is gradually shrinking, thus driving the popularity of portable electronic devices. Not only has the penetration rate of common electronic devices such as smart phones and tablets increased year by year, but also has the penetration rate of wearable electronic devices (e.g., smart watches, smart textiles). In addition to the pursuit of smaller sizes and lighter weight, factors such as fitness, beauty, and waterproofing of wearable electronic devices also need to be considered. Therefore, flexible substrates are often used in wearable electronic devices to meet the aforementioned requirements.

However, in a structure that uses a flexible substrate, stress problems such as contact deformation and detachment are likely to occur when the substrate is bent. For example, when a user wears clothing made of smart textiles, the flexible substrate in the smart textiles may be bent because the user may perform actions such as raising his/her hands, bending down, running, etc., which may result in the deformation or disconnect of the contact between the chip and the flexible substrate, and cause poor electrical contact of the electronic device.

SUMMARY

According to some embodiments of the present disclosure, a package structure including a hybrid pad is provided. The package structure may effectively reduce the stress of the contacts, avoid stress problems such as contact deformation or detachment when the substrate is bent due to user actions or other external forces, and further improve the yield of electronic devices using the package structure.

The embodiments of the present disclosure include a package structure. The package structure includes a substrate. The package structure also includes a hybrid pad disposed on the substrate. The hybrid pad includes a metal layer and a buffer layer connected to the metal layer. The Young's modulus of the buffer layer is less than the Young's modulus of the metal layer. The package structure further includes an electrically connecting structure disposed on the hybrid pad. The package structure includes a chip layer electrically connected to the electrically connecting structure. The package structure also includes a bonding pad disposed between the electrically connecting structure and the chip layer.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
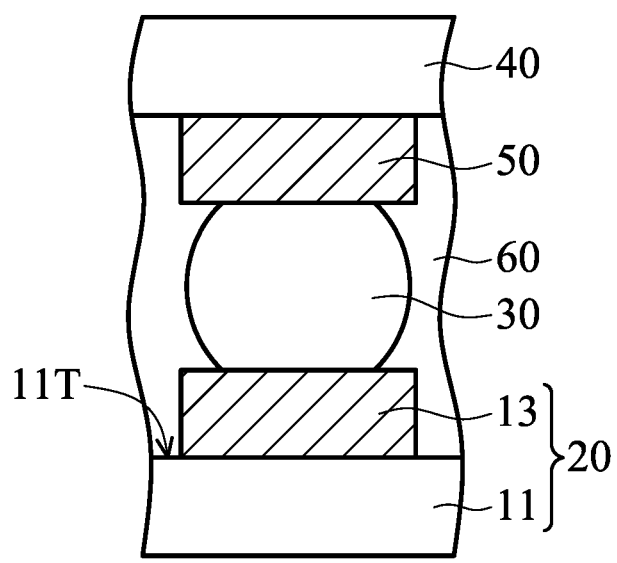
FIG. 1 is a partial cross-sectional view illustrating a package structure according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional operations can be provided before, during, and after the method, and some of the operations described can be replaced or eliminated for other embodiments of the method.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood through one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

Different embodiments disclosed below may repeat reference numerals and/or letters in the various examples. This repetition is for the purpose of simplicity and clarity and does not in itself dictate a relationship between the various embodiments and/or configurations discussed.

FIG. 1 is a partial cross-sectional view illustrating a package structure 100 according to one embodiment of the present disclosure. It should be noted that some components may be omitted in FIG. 1 and subsequent figures in the present disclosure in order to more clearly show the technical features of the embodiments of the present disclosure.

Referring to FIG. 1, the package structure 100 includes a substrate 11. In some embodiments, the substrate 11 may include an elementary semiconductor (e.g., silicon or germanium), a compound semiconductor (e.g., silicon carbide (SiC), gallium nitride (GaN), gallium phosphide (GaP), indium phosphide (InP), indium arsenide (InAs), indium antimonide (InSb), and so on), an alloy semiconductor (e.g., silicon germanium (SiGe), gallium arsenide phosphide (GaAsP), aluminum indium phosphide, aluminum gallium arsenide, gallium indium arsenide (GaInAs), gallium indium arsenide phosphide), any other applicable semiconductor, or a combination thereof, but the present disclosure is not limited thereto.

In some embodiments, the substrate 11 may be a flexible substrate or a flexible printed circuit board (FPCB). For example, the substrate 11 may include a core layer (e.g., polyimide (PI) or polyester (PET)), a copper foil layer, an adhesive film, a protective layer (e.g., epoxy), and so on, but the present disclosure is not limited thereto.

Referring to FIG. 1, the package structure 100 includes a hybrid pad 13 disposed on the (flexible) substrate 11. As shown in FIG. 1, in some embodiments, the (flexible) substrate 11 and the hybrid pad 13 may be regarded as a pad structure 20. The pad structure 20 is not limited to be used in the package structure 100 in the embodiments of the present disclosure.

In the embodiments of the present disclosure, the hybrid pad 13 includes a metal layer 131 and a buffer layer 133 (see the following FIG. 2 to FIG. 5), and the buffer layer 133 is connected to the metal layer 131. The shapes and different arrangements of the metal layer 131 and the buffer layer 133 will be described with reference to the following figures. In the embodiments of the present disclosure, the Young's modulus of the buffer layer 133 is less than the Young's modulus of the metal layer 131. For example, the Young's modulus of the buffer layer 133 may be between 1 and 10, but the present disclosure is not limited thereto. Since the Young's modulus of the buffer layer 133 is less than the Young's modulus of the metal layer 131, when the substrate 11 is bent because of external force (e.g., the user performs actions such as raising hands, bending down, running, etc.), it may effectively reduce the stress on the hybrid pad 13 and avoid stress problems such as contact deformation or disconnect.

In some embodiments, the material of the metal layer 131 may include copper, aluminum, a combination thereof, or an alloy thereof, but the present disclosure is not limited thereto. In some embodiments, the buffer layer 133 may include a conductive material. For example, the conductive material may include silver, nickel-copper, silver-nickel, silver-aluminum, silver-glass, silver-coated copper or carbon black, but the present disclosure is not limited thereto.

FIG. 2 to FIG. 5 are partial top views of the hybrid pads of different embodiments. The different hybrid pads shown in FIG. 2 to FIG. 5 may be regarded to as the partial top view of the hybrid pad 13 shown in FIG. 1. That is, FIG. 2 to FIG. may show the shapes and arrangements of the orthogonal projections of the metal layer 131 and the buffer layer 133 of the hybrid pad 13 on the top surface 11T of the (flexible) substrate 11.

It should be noted that the different hybrid pads shown in FIG. 2 to FIG. 5 are merely examples. In the hybrid pads according to the embodiments of the present disclosure, the orthogonal projections of the metal layer 131 and the buffer layer 133 of the hybrid pad 13 on the top surface 11T of the (flexible) substrate 11 may also be in different shapes or arranged in other ways. The embodiments of the present disclosure are not limited to these examples.

Figure 2:
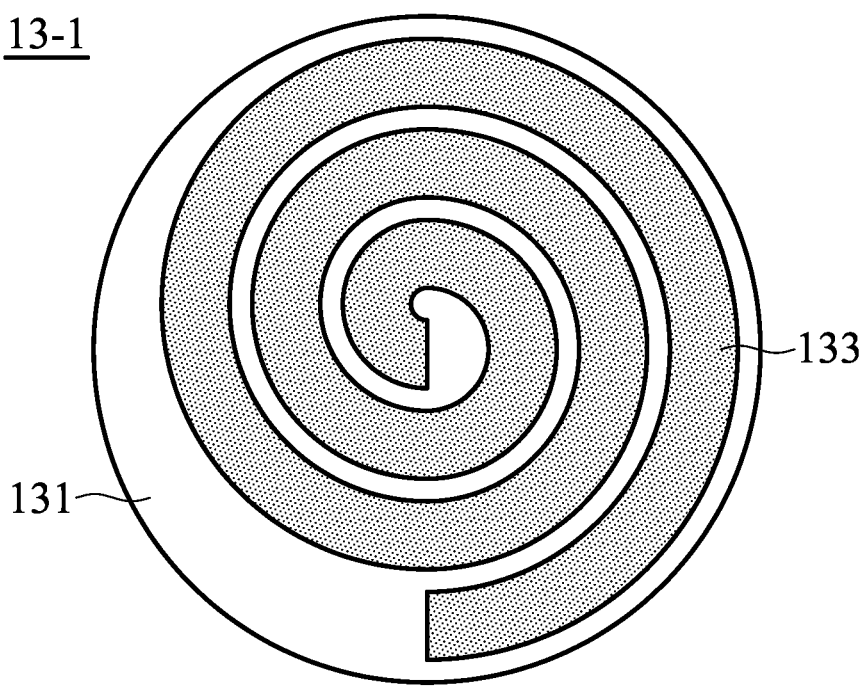
FIG. 2 is a partial top view illustrating a hybrid pad in one embodiment.

Referring to FIG. 2, in some embodiments, the orthogonal projection of the metal layer 131 of the hybrid pad 13-1 on the top surface 11T of the (flexible) substrate 11 and the orthogonal projection of the buffer layer 133 of the hybrid pad 13-1 on the top surface 11T of the (flexible) substrate 11 are alternately arranged, and the orthogonal projection of the metal layer 131 on the top surface 11T of the (flexible) substrate 11 and the orthogonal projection of the buffer layer 133 on the top surface 11T of the (flexible) substrate 11 are both spiral, but the present disclosure is not limited thereto.

Figure 3:
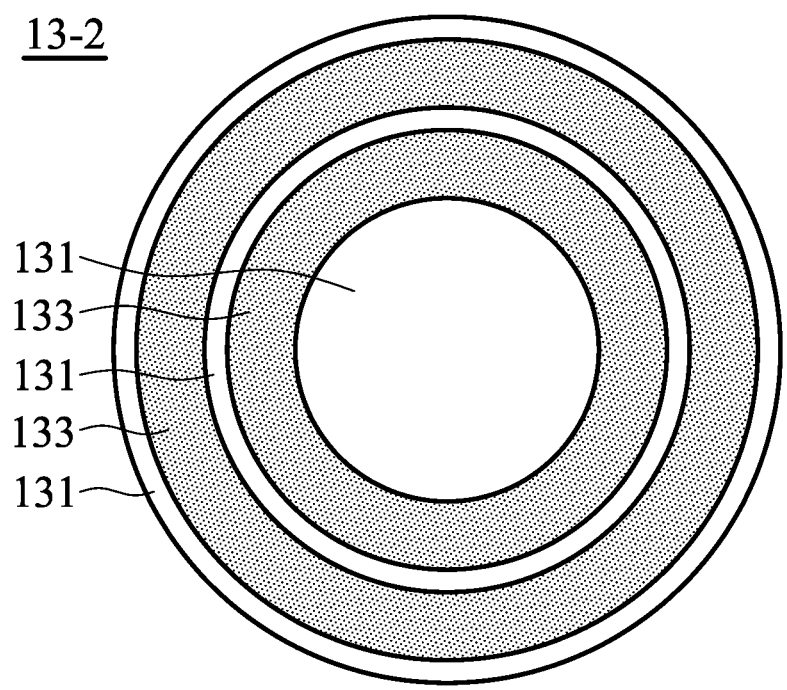
FIG. 3 is a partial top view illustrating a hybrid pad in another embodiment.

Referring to FIG. 3, in some embodiments, the hybrid pad 13-2 includes a plurality of metal layers 131 and a plurality of buffer layers 133. The orthogonal projections of the metal layers 131 on the top surface 11T of the (flexible) substrate 11 and the orthogonal projections of the buffer layers 133 on the top surface 11T of the (flexible) substrate 11 are alternately arranged, and the orthogonal projection of each metal layer 131 on the top surface 11T of the (flexible) substrate 11 and the orthogonal projection of each buffer layer 133 on the top surface 11T of the (flexible) substrate 11 are round. That is, the orthogonal projections of the metal layers 131 of the hybrid pad 13-2 on the top surface 11T of the (flexible) substrate 11 and the orthogonal projections of the buffer layers 133 the hybrid pad 13-2 on the top surface 11T of the (flexible) substrate 11 may be respectively arranged in concentric circles, but the present disclosure is not limited thereto. For example, the orthogonal projection of each metal layer 131 on the top surface 11T of the (flexible) substrate 11 and the orthogonal projection of each buffer layer 133 on the top surface 11T of the (flexible) substrate 11 may also be oval.

Figure 4:
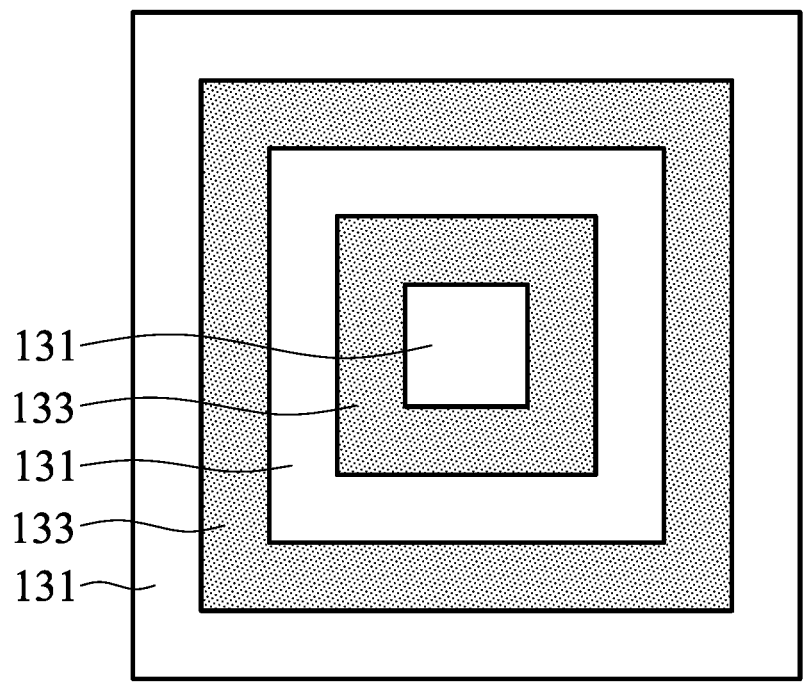
FIG. 4 is a partial top view illustrating a hybrid pad in another embodiment.

Referring to FIG. 4, in some embodiments, the hybrid pad 13-3 includes a plurality of metal layers 131 and a plurality of buffer layers 133. The orthogonal projections of the metal layers 131 on the top surface 11T of the (flexible) substrate 11 and the orthogonal projections of the buffer layers 133 on the top surface 11T of the (flexible) substrate 11 are alternately arranged, and the orthogonal projection of each metal layer 131 on the top surface 11T of the (flexible) substrate 11 and the orthogonal projection of each buffer layer 133 on the top surface 11T of the (flexible) substrate 11 are rectangular, but the present disclosure is not limited thereto. For example, the orthogonal projection of each metal layer 131 on the top surface 11T of the (flexible) substrate 11 and the orthogonal projection of each buffer layer 133 on the top surface 11T of the (flexible) substrate 11 may also be triangular, pentagonal, other polygonal or irregular.

Figure 5:
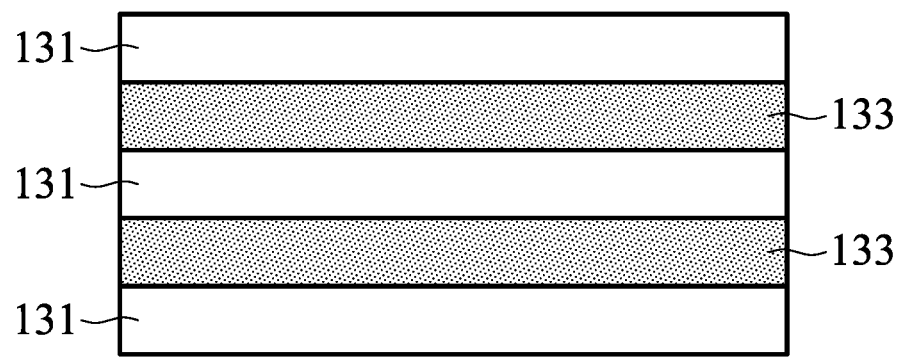
FIG. 5 is a partial top view illustrating a hybrid pad in another embodiment.

Referring to FIG. 5, in some embodiments, the hybrid pad 13-4 includes a plurality of metal layers 131 and a plurality of buffer layers 133. The orthogonal projections of the metal layers 131 on the top surface 11T of the (flexible) substrate 11 and the orthogonal projections of the buffer layers 133 on the top surface 11T of the (flexible) substrate 11 are parallel with each other and alternately arranged, but the present disclosure is not limited thereto.

Referring to FIG. 1, the package structure 100 includes an electrically connecting structure 30 disposed on the hybrid pad 13. As shown in FIG. 1, in some embodiments, the electrically connecting structure 30 may be a metal bump (e.g., solder ball, solder bump), tape-automated bonding (TAB), anisotropic conductive adhesive (ACA), anisotropic conductive film (ACF), polymer bump, or any other applicable conductive material, but the present disclosure is not limited thereto. The material of the electrically connecting structure 30 may be metal. For example, the metal may include copper, aluminum, a combination thereof, or an alloy thereof, but the present disclosure is not limited thereto.

Referring to FIG. 1, the package structure 100 includes a chip layer 40 electrically connected to the electrically connecting structure 30. In some embodiments, the chip layer 40 may be a semiconductor wafer (e.g., silicon wafer or any other applicable semiconductor wafer), which includes a plurality of chips. Alternatively, the chip layer 40 itself may represent a single wafer, but the present disclosure is not limited thereto.

In some embodiments, the chip layer 40 may include various conductive features (e.g., conductive lines or conductive vias). For example, the conductive features may be formed by aluminum (Al), copper (Cu), tungsten (W), their respective alloys, any other applicable conductive material, or a combination thereof, but the present disclosure is not limited thereto. Alternatively, the chip layer 40 may include various isolation features to separate different device regions in the chip layer 40. For example, the chip layer 40 may include shallow trench isolation (STI) features, but the present disclosure is not limited thereto.

Referring to FIG. 1, in some embodiments, the package structure 100 may include a bonding pad 50 disposed between the electrically connecting structure 30 and the chip layer 40. That is, the electrically connecting structure 30 may be disposed between hybrid pad 13 and the bonding pad 50. In some embodiments, the material of the bonding pad 50 may include copper, aluminum, gold, a combination thereof, or an alloy thereof, but the present disclosure is not limited thereto. In some embodiments, the package structure 100 may further include an under bump metallurgy (UBM) (not shown), and the under bump metallurgy may be disposed between the bonding pad 50 and the chip layer 40, but the present disclosure is not limited thereto.

In some embodiments, the (flexible) substrate 11 may be electrically connected to the chip layer 40 through the hybrid pad 13, the electrically connecting structure 30, and the bonding pad 50, but the present disclosure is not limited thereto. In some embodiments, conductive components that are not shown in FIG. 1 may also be disposed between the (flexible) substrate 11 and the chip layer 40 to electrically connect the (flexible) substrate 11 and the chip layer 40.

Referring to FIG. 1, in some embodiments, the package structure 100 may include an underfill layer 60 disposed between the (flexible) substrate 11 and the chip layer 40. For example, the underfill layer 60 may fill the space between the (flexible) substrate 11 and the chip layer 40 except for the space occupied by the hybrid pad 13, the electrically connecting structure 30, and the bonding pad 50, but the present disclosure is not limited thereto. In some embodiments, the underfill layer 60 may have a high Young's modulus and a low coefficient of thermal expansion (CTE), and may be matched with solder contacts. Moreover, the underfill layer 60 may make the chip layer 40 and the (flexible) substrate 11 have low moisture absorption and good adhesion characteristics, which may help improve the reliability of the package structure 100 (e.g., a flip chip package).

In some embodiments, the material of the underfill layer 60 may include a material with buffering characteristics, a material with protective characteristics, or a combination thereof. Alternatively, the material of the underfill layer 60 may have, for example, waterproof, antistatic, or antifouling effects. In some embodiments, the underfill layer 60 may be a single-layer material, a composite material, or a multi-layer material.

Furthermore, in some embodiments, the package structure 100 may further include a protective layer (e.g., a molding compound) (not shown). The protection layer may be disposed on the chip layer 40 to further fix the chip layer 40 and provide a buffer, prevent the chip layer 40 from detachment or being damaged, and protect the wafer and the circuit from being affected and damaged by the external environment.

In the foregoing embodiment, only a single hybrid pad 13, a single electrically connecting structure 30, and a single bonding pad 50 are provided between the (flexible) substrate 11 and the chip layer 40, but the present disclosure is not limited thereto.

Figure 6:
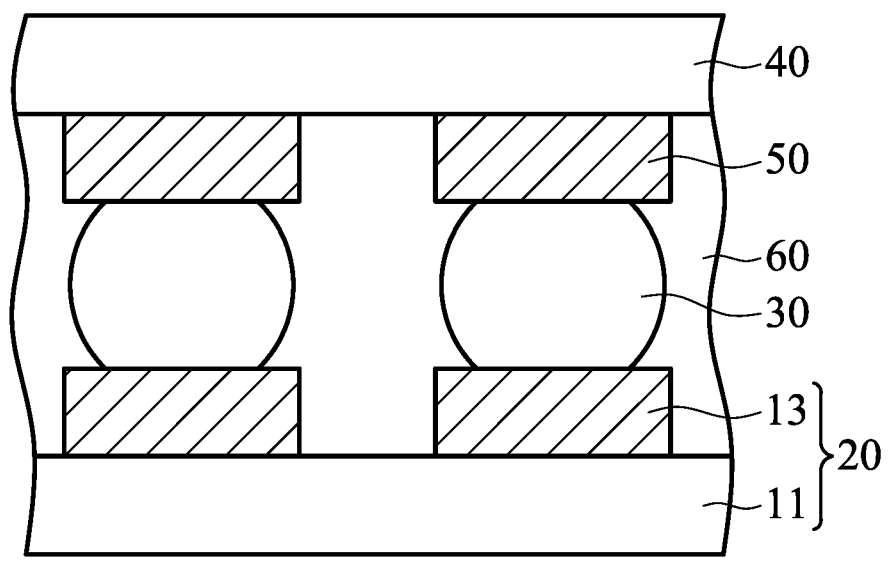
FIG. 6 is a partial cross-sectional view illustrating a package structure according to another embodiment of the present disclosure.

FIG. 6 is a partial cross-sectional view illustrating a package structure 102 according to another embodiment of the present disclosure. Referring to FIG. 6, the pad structure 20 may include a plurality of hybrid pads 13 (at least two hybrid pads 13) disposed on a single (flexible) substrate 11. In other words, a plurality of hybrid pads 13 (at least two hybrid pads 13), a plurality of electrically connecting structures 30 (at least two electrically connecting structures 30), and a plurality of bonding pads 50 (at least two bonding pads 50) may be provided between the (flexible) substrate 11 and the chip layer 40 of the package structure 102.

Referring to the embodiment shown in FIG. 6, in the stress simulation software, the material using copper as the metal layer (131) with the buffer layers (133) of different materials is analyzed, so that the equivalent Young's modulus of the hybrid pad 13 is reduced to 6 GPa. When the hybrid pad 13 is bent to a radius of curvature of 35 cm by an external force, the maximum stress value is 2.48 Mpa. However, compared with a comparative example (the contact pad is only a copper material), when the contact pad is also bent by an external force to a curvature radius of 35 cm, the maximum stress value is 21.3 Mpa. The simulation results prove that the package structure according to the embodiments of the present disclosure may effectively reduce the maximum stress value during bending.

Figure 7:
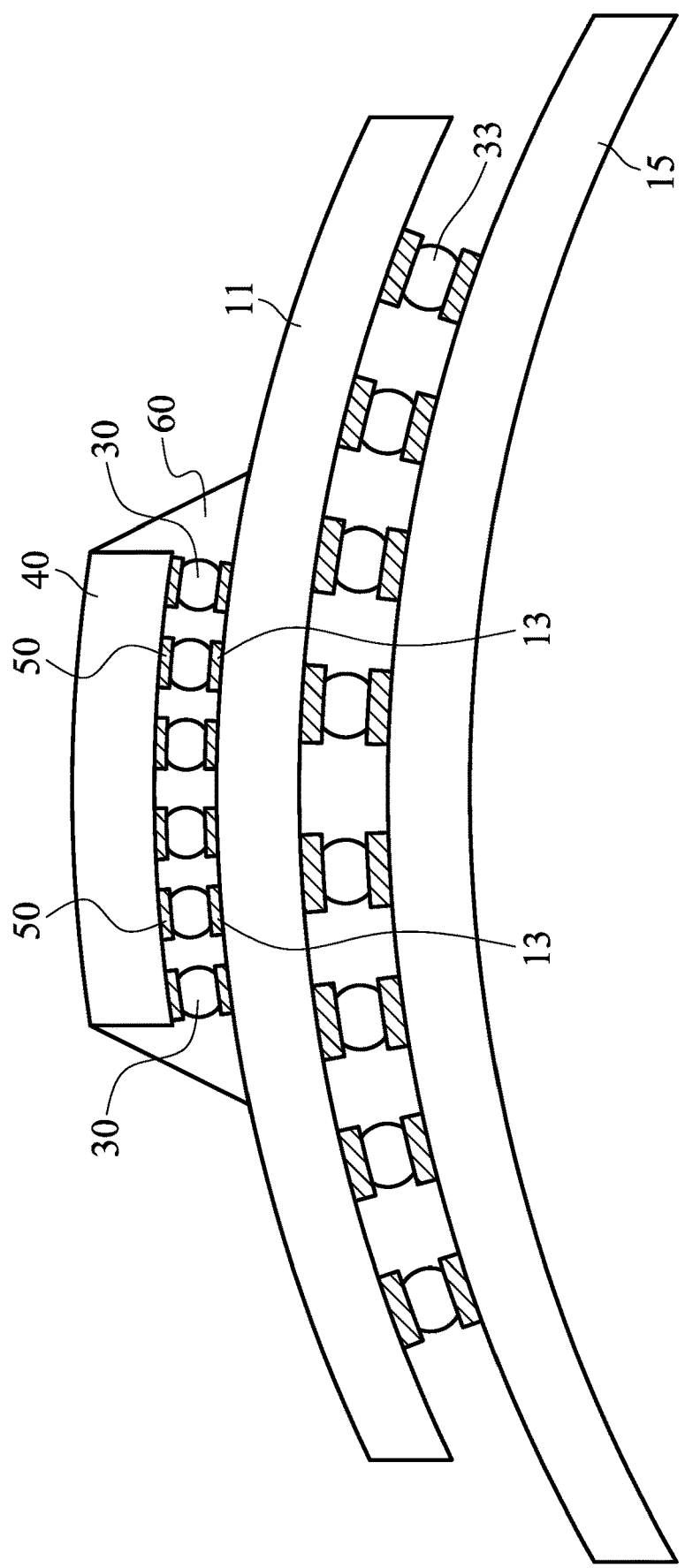
FIG. 7 is a partial cross-sectional view of applying the package structure according to one embodiment of the present disclosure to a wearable electronic device.

FIG. 7 is a partial cross-sectional view of applying the package structure 100 according to one embodiment of the present disclosure to a wearable electronic device. The wearable electronic device here is, for example, smart clothes made of smart textiles, but the present disclosure is not limited thereto.

Referring to FIG. 7, the substrate 11 may be, for example, a flexible IC interposer, on which a plurality of hybrid pads 13 of the present disclosure are disposed. Each hybrid pad 13 includes a metal layer (131) and a buffer layer (133), which is not described in detail here. Electrically connecting structures 30 are disposed on the hybrid pad, and a chip layer 40 is electrically connected to the substrate 11 through the electrically connecting structures 30. In more detail, bonding pads 50 are disposed between the electrically connecting structures 30 and the chip layer 40 to electrically connect the electrically connecting structures 30 and the chip layer 40. Moreover, an underfill layer 60 is disposed between the substrate 11 and the chip layer 40, and a package structure according to the embodiments of the present disclosure is completed.

It should be noted that although the hybrid pads 13 are described here, the embodiments of the present disclosure are not limited thereto. In some other embodiments, the hybrid pad 13 may be replaced with the hybrid pad 13-1 shown in FIG. 2, the hybrid pad 13-2 shown in FIG. 3, the hybrid pad 13-3 shown in FIG. 4, or the hybrid pad 13-4 shown in FIG. 5, which is not described in detail here.

As shown in FIG. 7, the package structure may be connected to and disposed on a flexible printed circuit (FPC) 15. In more detail, the substrate 11 (e.g., flexible IC interposer) may be connected to and disposed on the flexible printed circuit 15 through the electrically connecting structures 33 to form a fan-out redistribution layer (RDL) structure. This structure may be integrated on a wearable electronic device (e.g., smart clothes made of smart textiles).

Since the package structure according to the embodiments of the present disclosure includes a hybrid pad, when the substrate is bent due to user actions or other external forces, it may be effectively prevented from stress problems such as contact deformation or detachment, and may further improve the yield of electronic devices using the package structure.

In summary, the package structure according to the embodiment of the present disclosure includes a hybrid pad, and the hybrid pad includes a metal layer and a buffer layer having a lower Young's modulus than the metal layer, thereby effectively reducing the stress of the contacts, avoiding stress problems such as contact deformation or detachment when the substrate is bent due to user actions or other external forces, and further improving the yield of electronic devices using the package structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A package structure, comprising:
    a substrate;
    a hybrid pad disposed on the substrate, wherein the hybrid pad comprises a metal layer and a buffer layer connected to the metal layer, and a Young's modulus of the buffer layer is less than a Young's modulus of the metal layer;
    an electrically connecting structure disposed on the hybrid pad;
    a chip layer electrically connected to the electrically connecting structure; and
    a bonding pad disposed between the electrically connecting structure and the chip layer,
    wherein the metal layer and the buffer layer are in direct contact with the substrate.

2. The package structure according to claim 1, wherein the substrate is a flexible substrate.

3. The package structure according to claim 1, wherein an orthogonal projection of the metal layer on a top surface of the substrate and an orthogonal projection of the buffer layer on the top surface of the substrate are alternately arranged.

4. The package structure according to claim 3, wherein the orthogonal projection of the metal layer on the top surface of the substrate and the orthogonal projection of the buffer layer on the top surface of the substrate are spiral.

5. The package structure according to claim 3, wherein the hybrid pad comprises a plurality of metal layers and a plurality of buffer layers.

6. The package structure according to claim 5, wherein the orthogonal projections of the metal layers on the top surface of the substrate and the orthogonal projections of the buffer layers on the top surface of the substrate are round, oval, polygonal, or irregular.

7. The package structure according to claim 1, wherein the buffer layer comprises a conductive material.

8. The package structure according to claim 7, wherein the conductive material comprises silver, nickel-copper, silver-nickel, silver-aluminum, silver-glass, silver-coated copper or carbon black.

9. The package structure according to claim 1, wherein the Young's modulus of the buffer layer is between 1 and 10.

10. The package structure according to claim 1, wherein a material of the metal layer comprises copper, aluminum, a combination thereof, or an alloy thereof.

11. The package structure according to claim 1, wherein a material of the bonding pad comprises copper, aluminum, metal, a combination thereof, or an alloy thereof.

12. The package structure according to claim 1, further comprising:
    an underfill layer disposed between the substrate and the chip layer.

* * * * *